United States Patent
Mansour et al.

(10) Patent No.: US 11,743,769 B2
(45) Date of Patent: *Aug. 29, 2023

(54) METHOD AND SYSTEM FOR CONCURRENTLY TRANSMITTING SIGNALS

(71) Applicant: Sprint Spectrum L.P., Overland Park, KS (US)

(72) Inventors: Nagi Mansour, Arlington, VA (US); Akin Ozozlu, Mclean, VA (US); Kafi Hassan, Fairfax, VA (US)

(73) Assignee: Sprint Spectrum LLC, Bellevue, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/819,233

(22) Filed: Aug. 11, 2022

(65) Prior Publication Data
US 2022/0408312 A1 Dec. 22, 2022

Related U.S. Application Data

(63) Continuation of application No. 17/350,667, filed on Jun. 17, 2021, now Pat. No. 11,445,405.

(51) Int. Cl.
*H04W 4/00* (2018.01)
*H04W 28/06* (2009.01)
(Continued)

(52) U.S. Cl.
CPC ......... *H04W 28/065* (2013.01); *H03M 13/29* (2013.01); *H04B 7/0686* (2013.01); *H04W 72/0466* (2013.01)

(58) Field of Classification Search
CPC .......... H04W 28/065; H04W 72/0466; H04W 28/04; H04W 72/04; H04W 72/042;
(Continued)

(56) References Cited

U.S. PATENT DOCUMENTS 4,811,096 A * 3/1989 Gakumura ........... H03D 1/2254
348/732
4,933,767 A * 6/1990 Hyakutake ............. H04N 5/455
348/735
(Continued)

OTHER PUBLICATIONS

International Search Report and Written Opinion from International Application No. PCT/US2022/072950, dated Jul. 14, 2022.

*Primary Examiner* — Phuongchau Ba Nguyen
(74) *Attorney, Agent, or Firm* — McDonnell Boehnen Hulbert & Berghoff LLP

(57) ABSTRACT

A method and a system for concurrently transmitting from an antenna a first sequence of data from a first access node and a second sequence of data from a second access node. An example method includes orthogonally encoding the first and second sequences, including encoding the first sequence with a first binary code to produce a first encoded sequence and encoding the second sequence with a second binary code to produce a second encoded sequence, combining the first encoded sequence and the second encoded sequence to produce a combined encoded sequence, and transmitting the combined encoded sequence from the antenna, with transmitting the combined encoded sequence from the antenna including engaging in a first transmission of the combined encoded sequence from the antenna and engaging in a second transmission of the combined encoded sequence from the same antenna with a phase delay compared with the first transmission.

13 Claims, 4 Drawing Sheets

(51) Int. Cl.
*H03M 13/29* (2006.01)
*H04W 72/044* (2023.01)
*H04B 7/06* (2006.01)

(58) Field of Classification Search
CPC .... H04W 88/08; H03M 13/29; H04B 7/0686; H04J 13/0003; H04J 13/102; H04J 13/004; H04L 5/0007
See application file for complete search history.

(56) References Cited

U.S. PATENT DOCUMENTS

| | | | | |
|---|---|---|---|---|
| 5,471,497 | A * | 11/1995 | Zehavi | H04J 13/00 375/150 |
| 5,648,823 | A * | 7/1997 | Stepp | H04N 5/455 455/337 |
| 6,151,328 | A | 11/2000 | Kwon et al. | |
| 8,766,690 | B2 * | 7/2014 | Yen | G09G 5/008 327/170 |
| 10,790,936 | B1 | 9/2020 | Mansour et al. | |
| 11,165,528 | B1 | 11/2021 | Mansour et al. | |
| 2004/0156454 | A1 * | 8/2004 | Kim | H04B 1/7115 375/E1.032 |
| 2004/0184515 | A1 | 9/2004 | Im | |
| 2010/0216459 | A1 | 8/2010 | Yu et al. | |
| 2013/0038582 | A1 * | 2/2013 | Yen | G09G 3/2096 345/204 |

\* cited by examiner

METHOD AND SYSTEM FOR CONCURRENTLY TRANSMITTING SIGNALS

CROSS REFERENCE TO RELATED APPLICATION

This is a continuation of U.S. patent application Ser. No. 17/350,667 filed on Jun. 17, 2021, which is incorporated herein by reference in its entirety.

BACKGROUND

A typical wireless communication system includes a number of cell sites, each including one or more access nodes configured to provide coverage in which user equipment devices (UEs) such as cell phones, tablet computers, machine-type-communication devices, tracking devices, embedded wireless modules, and/or other wirelessly equipped communication devices (whether or not user operated), can operate. Further, each access node could be coupled with a core network that provides connectivity with various application servers and/or transport networks, such as the public switched telephone network (PSTN) and/or the Internet for instance. With this arrangement, a UE within coverage of the system could engage in air-interface communication with an access node and could thereby communicate via the access node with various application servers and other entities.

Such a system could operate in accordance with a particular radio access technology (RAT), with communications from an access node to UEs defining a downlink or forward link and communications from the UEs to the access node defining an uplink or reverse link.

Over the years, the industry has developed various generations of RATs, in a continuous effort to increase available data rate and quality of service for end users. These generations have ranged from "1G," which used simple analog frequency modulation to facilitate basic voice-call service, to "4G"—such as Long Term Evolution (LTE), which now facilitates mobile broadband service using technologies such as orthogonal frequency division multiplexing (OFDM) and multiple input multiple output (MIMO). And recently, the industry has completed initial specifications for "5G" and particularly "5G NR" (5G New Radio), which may use a scalable OFDM air interface, advanced channel coding, massive MIMO, beamforming, and/or other features, to support higher data rates and countless applications, such as mission-critical services, enhanced mobile broadband, and massive Internet of Things (IoT).

In accordance with the RAT, each access node could provide service on one or more radio-frequency (RF) carriers, each of which could be frequency division duplex (FDD), with separate frequency channels for downlink and uplink communication, or time division duplex (TDD), with a single frequency channel multiplexed over time between downlink and uplink use. Each such frequency channel could be defined as a specific range of frequency (e.g., in radio-frequency (RF) spectrum) having a bandwidth and a center frequency and thus extending from a low-end frequency to a high-end frequency.

Further, on the downlink and uplink channels, the coverage of each access node could define an air interface configured in a specific manner to define physical resources for carrying information wirelessly between the access node and UEs.

Without limitation, for instance, the air interface could be divided over time into frames, subframes, and symbol time segments, and over frequency into subcarriers that could be modulated to carry data. The example air interface could thus define an array of time-frequency resource elements each being at a respective symbol time segment and subcarrier, and the subcarrier of each resource element could be modulated to carry data. Further, in each subframe or other transmission time interval (TTI), the resource elements on the downlink and uplink could be grouped to define physical resource blocks (PRBs) that the access node could allocate as needed to carry data between the access node and served UEs.

In addition, certain resource elements on the example air interface could be reserved for special purposes. For instance, on the downlink, certain resource elements could be reserved to carry synchronization signals that UEs could detect as an indication of the presence of coverage and to establish frame timing, a reference signal that UEs could measure in order to determine coverage strength, and other control signaling such as PRB-scheduling directives and acknowledgement messaging from the access node to served UEs. And on the uplink, certain resource elements could be reserved to carry random access signaling from UEs to the access node, and other control signaling such as PRB-scheduling requests and acknowledgement signaling from UEs to the access node.

To facilitate providing this coverage and service, each cell site could include an antenna structure through which the access node(s) of the cell site can engage in air interface communication. For instance, each cell site could include an antenna array, which could be connected through RF circuitry with a baseband unit of each access node of the cell site. A representative antenna array could have a number of antennas (or antenna elements), such as a number of transmit antennas for use to engage in downlink air-interface communication and a number of receive antennas for use to engage in uplink air-interface communication.

OVERVIEW

In example operation, when a UE enters into coverage of such a system, the UE could initially scan for and detect threshold strong coverage of an access node on a carrier, and the UE could responsively engage in signaling with the access node to establish a Radio Resource Control (RRC) connection between the UE and the access node. Further, if appropriate, the UE could then engage in attach signaling, via the access node, with a core-network controller to attach and thus register for service, and the core-network controller and access node could coordinate setup for the UE of one or more user-plane bearers, each including an access-bearer that extends between the access node and a core-network gateway system providing connectivity with a transport network and each including a data-radio-bearer (DRB) that extends over the air between the access node and the UE.

Once the UE is connected and attached, the access node could then serve the UE with packet-data communications through the antenna connected to the access node.

For instance, when the core-network gateway system receives packet data for transmission to the UE, the data could flow over the UE's access bearer to the access node, and the access node could buffer the data, pending transmission of the data over the UE's DRB to the UE. With the example air-interface configuration noted above, the access node could then allocate downlink PRBs in an upcoming subframe for carrying at least some of the data to the UE.

And in that subframe, the access node could transmit through the antenna to the UE a scheduling directive that indicates which PRBs will carry the data, and the access node could transmit the data to the UE in those PRBs by modulating the data on the subcarriers of resource elements of those PRBs. Further, to facilitate this downlink communication, the UE could regularly monitor every downlink subframe for the presence of any such scheduling directive to the UE. And upon detecting and reading the scheduling directive, the UE could then read the transmitted data from the indicated PRBs.

Likewise, on the uplink, when the UE has packet data for transmission on the transport network, the UE could buffer the data, pending transmission of the data over the UE's DRB to the access node, and the UE could transmit to the access node a scheduling request that carries a buffer status report (BSR) indicating the quantity of data that the UE has buffered for transmission. With the example air-interface configuration, the access node could then allocate uplink PRBs in an upcoming subframe to carry at least some of the data from the UE and could transmit to the UE a scheduling directive indicating those upcoming PRBs. Similarly here, the UE could monitor each downlink subframe for the presence of such a scheduling directive. And upon detecting and reading the scheduling directive, the UE could accordingly transmit the data to the access node in the indicated PRBs, similarly by modulating the data on the subcarriers of resource elements of those PRBs.

In a representative system where a cell site include at least two access nodes, such as access nodes operating according to different RATs than each other, the access nodes may support serving a UE concurrently with data communications. For instance, if a cell site has a 4G LTE access node and a 5G NR access node, the access nodes could be configured to cooperatively provide a UE with 4G-5G dual connectivity such as EUTR-NR Dual Connectivity (EN-DC), among other possibilities. Having two or more access nodes serve a UE concurrently can help to increase the UE's peak data rate, which may provide improved user experience.

One technical issue with having two access nodes of a cell site serve a UE concurrently, however, is that the access nodes may need to operate on separate respective carriers or at least on separate respective RF resources within a carrier, and may need to provide separate respective antenna transmissions to the UE, to help avoid interference between one access node's transmissions to the UE and the other access node's transmissions to the UE. Unfortunately, however, given RF spectrum licensing costs and given constraints in terms of coverage scope, this arrangement can be restrictive.

The present disclosure provides an improved mechanism to help address this issue.

In accordance with the disclosure, when two access nodes of a cell site are concurrently serving a UE and each access node has a respective data sequence to transmit to the UE, the access nodes' respective data sequences will be orthogonally coded, the orthogonally-coded data sequences will be combined together to produce a combined data sequence, and the combined data sequence will then be transmitted from an antenna of the cell site to the UE.

In an example implementation of this process, one of the access nodes could serve as a primary access node, and the other access node could serve as a secondary access node. Through signaling with each other, the access nodes could establish that they each have a respective data sequence to send to the same UE. Each access node could then encode its respective data with a respective orthogonal code to produce a respective orthogonally coded data sequence. For instance, the primary access node could encode its respective data sequence with a first binary code to produce a first orthogonally coded data sequence, and the secondary access node could encode its respective data sequence with a second binary code that is orthogonal to the first binary code (e.g. having zero cross-correlation with the first binary code) to produce a second orthogonally coded data sequence. And the secondary access node could then transmit its second orthogonally coded data sequence to the primary access node.

The primary access node could then combine together both access nodes' orthogonally coded data sequences to produce the combined data sequence. And the primary access node could then schedule and provide transmission of the combined data sequence to the UE, in the manner discussed above for instance, perhaps noting to the UE in a scheduling directive that the transmission is a combination of data from the primary access node and data from the secondary access node. Further, upon receipt of the combined data sequence, the UE could then extract each access node's respective data sequence and could process the extracted data accordingly.

Given that this combined transmission includes data from both access nodes, it may be especially desirable to help ensure successful receipt of the combined data sequence by the UE. To help facilitate this, the present disclosure also provides for multi-phase transmission of the combined data sequence. In particular, the primary access node could interwork with other components of the cell site to cause the combined data sequence to be transmitted with a first phase delay and then again with a second phase delay different than the first phase delay. Automatically so transmitting the combined data sequence at least twice with different phase delays may help to simulate a multi-path or transmit-diversity effect, which may help to ensure that the UE successfully receives the transmission.

These as well as other aspects, advantages, and alternatives will become apparent to those of ordinary skill in the art by reading the following detailed description, with reference where appropriate to the accompanying drawings. Further, it should be understood that the descriptions provided in this overview and below are intended to illustrate the invention by way of example only and not by way of limitation.

DETAILED DESCRIPTION

As noted above, FIG. 1 is a simplified block diagram of an example network arrangement in which features of the present disclosure can be implemented. It should be understood, however, that the principles disclosed herein could extend to apply with respect to other scenarios as well. Further, it should be understood that other variations from the specific arrangements and processes described are possible. For instance, various described entities, connections, functions, and other elements could be added, omitted, distributed, re-located, re-ordered, combined, or changed in other ways. In addition, it will be understood that technical operations disclosed as being carried out by one or more entities could be carried out at least in part by a processing unit programmed to carry out the operations or to cause one or more other entities to carry out the operations.

Figure 1:
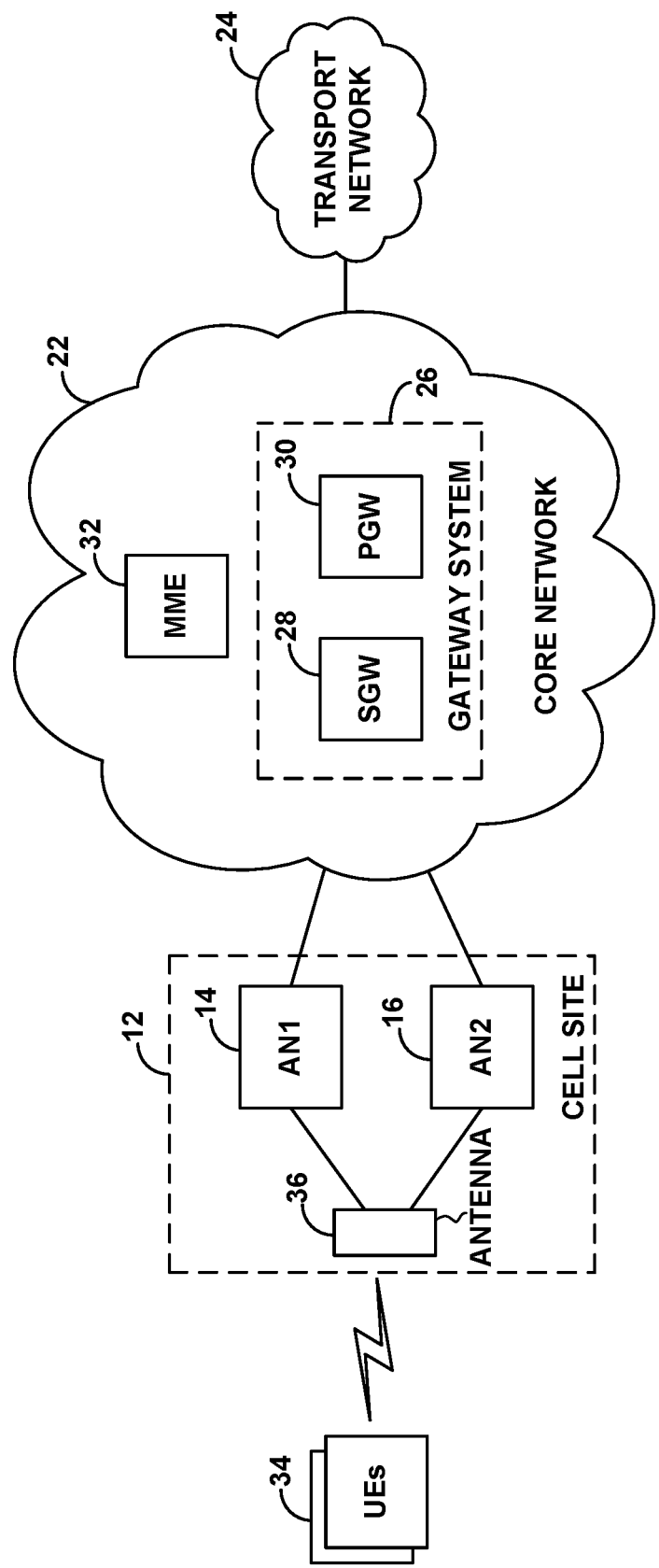
FIG. 1 is a simplified block diagram of an example network arrangement in which features of the present disclosure can be implemented.

FIG. 1 depicts a cell site 12 having two example access nodes, a first access node 14, and a second access node 16, and antenna (e.g., antenna array) 36 through which the access nodes 14, 16 can engage in air interface communication. Access nodes 14, 16 could be two of many access nodes that could be included in cell site 12. Further, either or both access nodes, and/or other aspects of the cell site 12 could define a computing system that could perform various operations discussed herein.

Access nodes 14, 16 could each take various forms. For example, either or each access node could be a macro access node, a small cell access node, or other type of access node designed to provide wireless coverage in which to serve UEs. Further, the access nodes could be configured to serve UEs in accordance with one or more defined RATs, such as one according to 4G LTE and the other according to 5G NR for instance, and the access nodes could vary in form from each other.

Access nodes 14, 16 are also interconnected with one or more core networks 22, which could provide connectivity with one or more external transport networks 24 such as the Internet for instance. Each such core network could take various forms, examples of which include without limitation an Enhanced Packet Core (EPC) network and a Next Generation Core (NGC) network. As shown by way of example, the core network could include a mobility management entity (MME) 32, a serving gateway (SGW) 28, and a packet-data-network gateway (PGW) 30, among other nodes. With this example arrangement, each access node could have established communication interfaces with the MME 32, with the SGW 28, and with other access node, the MME 32 could have a communication interface with the SGW 28, the SGW 28 could have a communication interface with the PGW 30, and the PGW 30 could provide connectivity with the transport network 24.

FIG. 1 illustrates a number of UEs within coverage of this cell site 12. Each such UE could take any of the forms noted above, among other possibilities. And the UE could be configured to be served concurrently by multiple access nodes, such as by access node 14 and access node 16. For instance, the UE could be equipped with multiple radios, to enable the UE to be served concurrently by the multiple access nodes.

In line with the discussion above, when a UE enters into coverage of each such access node, the UE could discover coverage of the access node on a respective carrier, such as by reading broadcast signaling from the access node on the carrier, and the UE could then engage in random access and connection signaling with the access node to establish a connection through which the access node could then serve the UE. Further, if the UE is not yet registered for service, the UE could engage in attachment signaling with the MME 32 via the access node, and the MME 32 could coordinate setup of one or more user-plane bearer tunnels between the UE and the PGW 30 including for each a DRB over the air between the access node and the UE and an access bearer through the core network between the access node and the PGW 30. The access node may then serve the UE on the carrier, coordinating use of air interface resources such as PRBs to carry data to and from the UE as described above.

Further in line with the discussion above, when a representative UE is so connected with and served by both access nodes 14, 16, it may be useful to combine the access nodes' transmissions to the UE, so as to provide a combined transmission to the UE. In particular, when access node 14 has a sequence of data to send to the UE and access node 16 also has a sequence of data to send to the UE, it may be worthwhile to combine those sequences together and transmit the resulting combined sequence to the UE in a single beam (antenna transmission path) on a single set of air-interface resources, rather than providing separate transmissions.

To facilitate this in an example implementation, a computing system could orthogonally encode the sequences and combine the orthogonally coded sequences to produce a combined sequence and could then output that combined sequence for transmission to the UE. Further, the computing system could help ensure successful transmission of the combined sequence by intentionally providing the transmission multiple times with different respective phase delays.

By way of example, if each access node's respective data sequence is a binary bit sequence, the access nodes, operating as representative components of the computing system, could encode their respective bit sequences with binary codes $C_1$, $C_2$ (such as Walsh codes for instance) that are orthogonal to each other in that they would have zero cross-correlation with each other. Namely, if access node 14 has a first bit sequence to transmit to the UE, access node 14 could encode that first bit sequence with code $C_1$ to produce a first encoded bit sequence, and if access node 16 has a second bit sequence to transmit to the UE, access node 16 could encode that second bit sequence with code $C_2$ to produce a second encoded bit sequence. Access node 16 could then send to access node 14 its second encoded bit sequence. And access node 14 could then combine the first and second orthogonally encoded bit sequences together to produce a combined bit sequence. Further, access node 14 could then coordinate transmission of the combined bit sequence to the UE, with multiple transmissions having different phase delays as noted above.

In an example implementation, without limitation, the act of encoding each underlying bit sequence with a binary code could involve XOR'ing (applying the logical XOR operation to) successive bits of the bit sequence with the binary code. For instance, if the binary code is eight bits long, a computing system could XOR every eight bits of the bit sequence with the binary code. In turn, the act of extracting an underlying bit sequence from the combination of the encoded bit sequences could similarly involve XOR'ing the combined bit sequence with the same binary code.

Further, the act of combining the two encoded sequences could involve AND'ing (applying the logical AND operation to) successive bits of each of the two sequences of code. For instance, if the two encoded sequences are a first and second encoded sequence comprising eight bits each, then a computing system could AND every eight bits of the first encoded sequence with every eight bits of the second encoded sequence.

The act of transmitting the combined sequence multiple times with different phase delays could then involve signaling between access node 14 and the antenna 36. For instance, a baseband unit of access 14 could communicate with a remote radio head of the antenna 36, engaging in signaling to cause the transmission of the combined bit sequence to occur with a first phase delay and automatically then again with a different, second phase delay. Thus, the second transmission would have a different phase delay than the first transmission.

Note that the term "phase delay" could refer to the phase of the respective RF transmission waveform. Thus, the two transmissions having different phase delays than each other could mean that the two transmissions have different phases than each other, such as that the second transmission is shifted by some number of degrees from the first transmission, among other possibilities. To facilitate this, the system could engage in the first transmission of the combined bit sequence and could then wait a predetermined amount of time and then engage in the second transmission of the combined sequence, with the predetermined amount of time being set such that the two transmissions would be out of phase with each other.

As indicated above, when coordinating the combined transmission to the UE, access node 14 could include in its scheduling directive to the UE an indication that the transmission being provided to the UE is a special transmission as so described. Namely, access node 14 could include in its scheduling directive to the UE a codeword or the like that the UE is configured to interpret to mean that the transmission is a combination of data sequences from both access node 14 and access node 16.

Upon receiving this transmission, the UE could then decode the sequence, extracting the respective underlying bit sequences by using the same binary orthogonal codes $C_1$, $C_2$ that the access nodes used to encode the sequences in the first place. For example, the UE could apply the first code $C_1$ to the received combined sequence to extract the first underlying bit sequence, and the UE could apply the second $C_2$ to the received combined sequence to extract the second underlying bit sequence.

Note also that many variations from the above-described arrangement and process could be possible. By way of example, rather than having access nodes 14, 16 separately encode their respective bit sequences, access node 16 could provide its bit sequence to access node 14, and access node could orthogonally encode its own bit sequence and the bit sequence provided by access node 14. Access node 16 could then combine the orthogonally encoded bit sequences together and so forth as noted above. Other variations could be possible as well.

Figure 2:
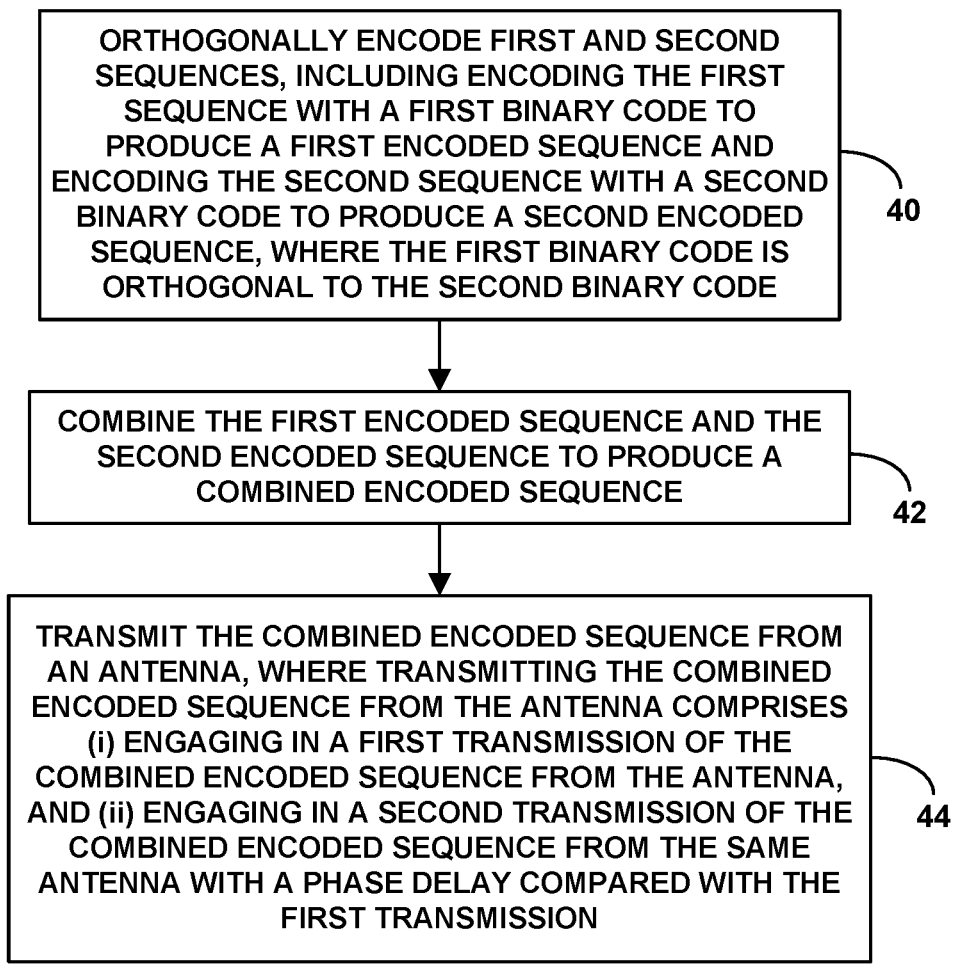
FIG. 2 is a flow chart depicting a method that could be carried out in accordance with the disclosure.

FIG. 2 is next a flow chart depicting an example method that could be carried out to facilitate concurrent transmission from an antenna of (i) a first sequence of data from a first access node and (ii) a second sequence of data from a second access node.

As shown in FIG. 2, at block 40, the method includes orthogonally encoding the first and second sequences, including encoding the first sequence with a first binary code to produce a first encoded sequence and encoding the second sequence with a second binary code to produce a second encoded sequence, where the first binary code is orthogonal to the second binary code. And at block 42, the method includes combining the first encoded sequence and the second encoded sequence to produce a combined encoded sequence. At block 44, the method includes transmitting the combined encoded sequence from an antenna, where transmitting the combined encoded sequence from the antenna comprises (i) engaging in a first transmission of the combined encoded sequence from the antenna, and (ii) engaging in a second transmission of the combined encoded sequence from the same antenna with a phase delay compared with the first transmission.

In line with the discussion above, the first and access nodes may serve one or more UEs. Specifically, the first and second access nodes may serve a common UE, and transmitting the combined encoded sequence could be to the common UE. Additionally or alternatively, the first access node could serve a first UE, and the second access node could serve a second UE different from the first UE, and transmitting the combined encoded sequence could be to the first and second UE.

Further, as mentioned above, the act of encoding and combining the sequences could involve binary bit-wise operations. For example, encoding the first sequence with the first binary code could comprise XOR'ing (performing an XOR operation to) the first sequence and the first binary code to produce the first encoded sequence, and encoding the second sequence with the second binary code could comprise XOR'ing the second sequence with the second binary code to produce the second encoded sequence. Additionally, combining the first encoded sequence and the second encoded sequence could include at least summing the first encoded sequence with the second encoded sequence to produce the combined encoded sequence, and summing the first encoded sequence with the second encoded sequence could comprise AND'ing (performing an AND operation to) the first encoded sequence and the second encoded sequence.

Further, the first binary code and the second binary codes may have zero cross-correlation with each other. Specifically, the first and second binary codes may be Walsh codes.

Still further, the first transmission of the combined encoded sequence may occur with a first phase, and engaging in the second transmission of the combined encoded sequence from the same antenna with the phase delay may include transmitting, after the first transmission, the combined sequence from the same antenna after a predefined amount of time at a second phase, and the second phase may be different from the first phase.

The steps of the example method could be carried out by a cell site, including, for example, access node 14, access node 16, antenna 36, MME 32, and so on. The cell site could include and/or define a computing system. In some examples, the steps of the example method may be carried out by multiple computing systems. For example, encoding the first sequence with the first binary code to produce the first encoded sequence may be carried out by the first access node, and encoding the second sequence with the second binary code to produce the second encoded sequence may be carried out by the second access node.

Figure 3:
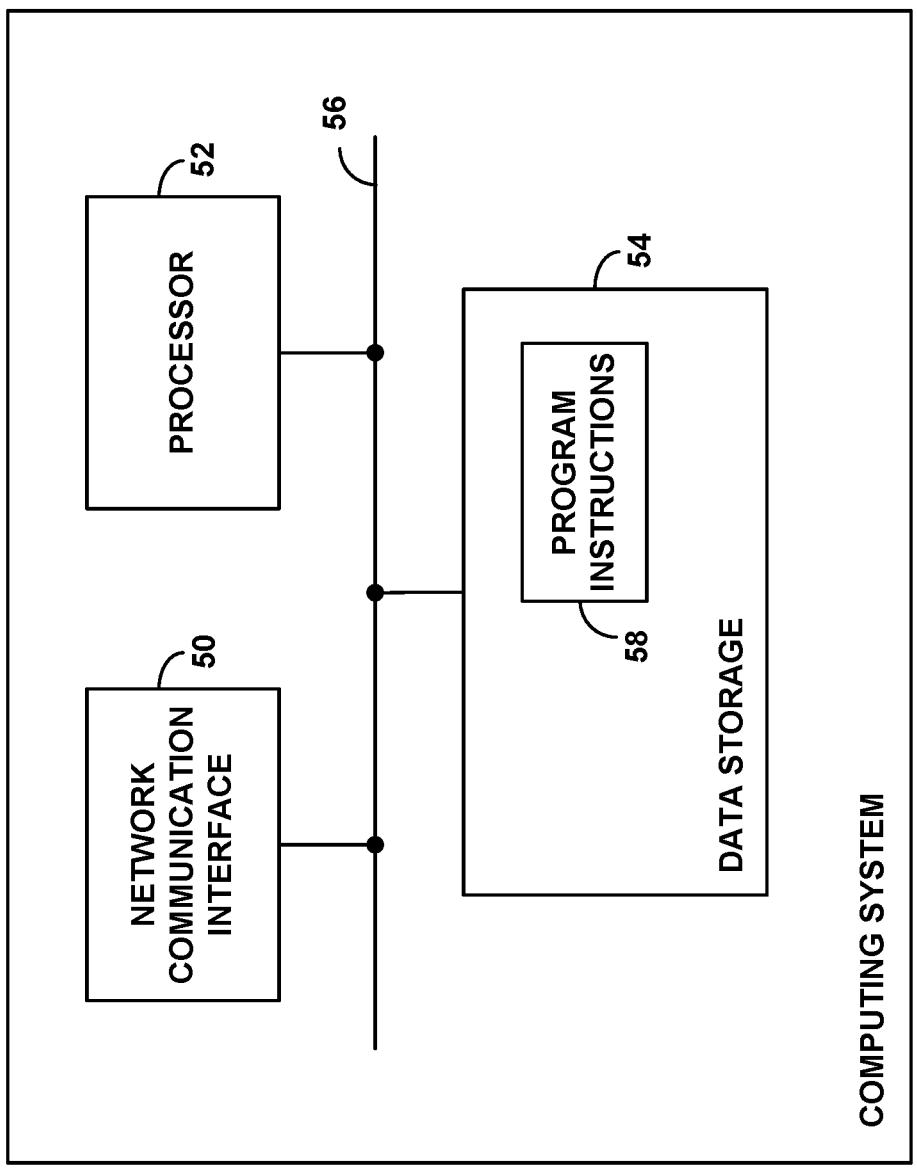
FIG. 3 is a simplified block diagram of an example computing system operable in accordance with the disclosure.

FIG. 3 is next a simplified block diagram of an example computing system that could be operable in accordance with the present disclosure to facilitate concurrent transmission of data from at least two access nodes. As noted above, such a computing system could be provided at or more of the entities shown in FIG. 1, among other possibilities.

As shown in FIG. 3, the example computing system includes at least one network communication interface 50, at least one processor 52, and at least one non-transitory data storage 54, which could be integrated together and/or interconnected by a system bus, network, or other connection mechanism 56.

The at least one network communication interface 50 could comprise a physical network connector (e.g., an Ethernet interface) and associated communication logic (e.g., protocol stacks) to facilitate wired or wireless network communication with various other entities. The at least one processor 52 could comprise one or more general purpose processors (e.g., microprocessors) and/or one or more specialized processors (e.g., application specific integrated circuits). And the at least one non-transitory data storage 54 could comprise one or more volatile and/or non-volatile storage components (e.g., magnetic, optical, or flash storage, necessarily non-transitory).

As shown, the at least one non-transitory data storage 54 could then store program instructions 58. These program instructions could be executable by the at least one processor 52 to cause the computing system to carry out various operations described herein, including but not limited to the operations discussed above in relation to FIG. 2.

Various other features discussed herein can be implemented in this context as well, and vice versa.

Figure 4:
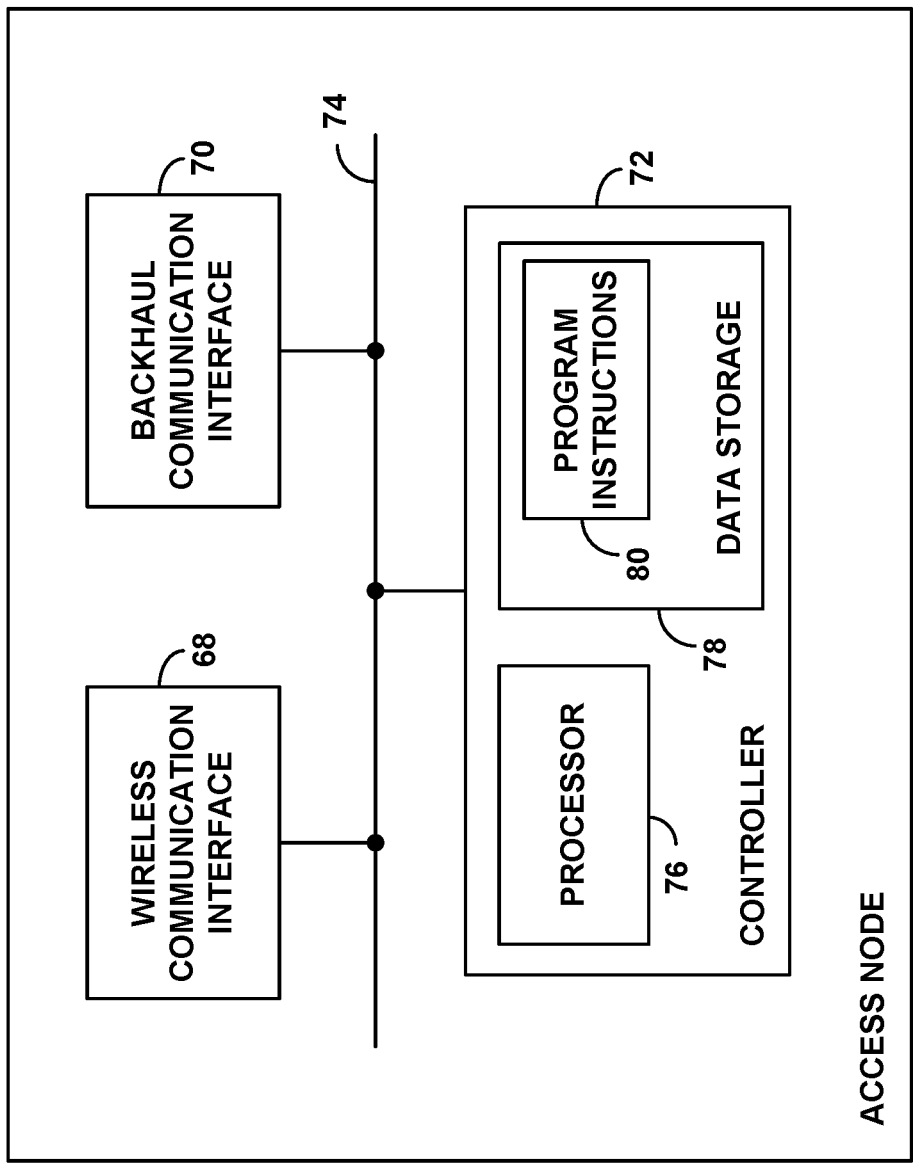
FIG. 4 is a simplified block diagram of an example access node operable in accordance with the disclosure.

FIG. 4 is next a simplified block diagram of an example access node that could be operable in accordance with the present disclosure to control configuration of an air interface between an access node and a UE, where the air interface is divided over time into frames and the frames are further divided at least into subframes, and where the air interface operates in accordance with a time-division-duplex configuration that defines at least a number of uplink subframes per frame for communication over the air interface.

As shown in FIG. 4, the example access node includes at least one wireless communication interface 68, at least one backhaul communication interface 70, and at least one controller 72, all of which could be integrated together and/or communicatively linked together by a system bus, network, or other connection mechanism 74.

In an example implementation, the at least one wireless communication interface 68 could comprise an antenna structure, which could be tower mounted or could take other forms, and associated components such as a power amplifier and a wireless transceiver, so as to facilitate providing coverage on one or more carriers and serving the UE over the air-interface connection. And the at least one backhaul communication interface 70 could comprise network communication interface such as an Ethernet interface, through which the access node could engage in backhaul communication, such as communication on a core network and with another access node.

Further, the at least one controller 72 could comprise at least one processor 76 (e.g., one or more general purpose processors and/or one or more specialized processors) programmed to cause the access node to carry out various operations such as those discussed herein. For instance, the at least one controller 72 could comprise at least one non-transitory data storage 78 (e.g., one or more magnetic, optical, or flash storage components, necessarily non-transitory) which could store program instructions 80 executable by the at least one processor to cause the access node to carry out such operations.

Various other features discussed herein can be implemented in this context as well, and vice versa.

Further, the present disclosure also contemplates a non-transitory computer-readable medium having encoded thereon (e.g., storing, embodying, containing, or otherwise incorporating) program instructions executable to cause a processing unit to carry out operations such as those described above.

Exemplary embodiments have been described above. Those skilled in the art will understand, however, that changes and modifications may be made to these embodiments without departing from the true scope and spirit of the invention.

What is claimed is:

1. A method for multi-phase transmission of a data sequence from an antenna, the method comprising:

engaging in a first transmission of the data sequence from the antenna; and automatically engaging in a second transmission of the data sequence from the antenna with a phase delay compared with the first transmission, wherein automatically engaging in the second transmission of the data sequence from the antenna with the phase delay comprises automatically engaging in the second transmission of the data sequence after engaging in the first transmission of the data sequence, wherein engaging in the first transmission of the data sequence occurs with a first phase, and wherein engaging in the second transmission of the data sequence occurs with a second phase different from the first phase, wherein the data sequence is a combined encoded sequence comprising a first sequence of data and a second sequence of data, and wherein engaging in the first transmission and automatically engaging in the second transmission with the phase delay helps to simulate a multi-path effect and helps to facilitate successful receipt of the data sequence by a receiving device.

2. The method of claim 1, wherein automatically engaging in the second transmission of the data sequence from the antenna with the phase delay comprises:

automatically engaging in the second transmission of the data sequence a predefined amount of time after engaging in the first transmission of the data sequence.

3. The method of claim 1, wherein the first transmission and the second transmission have different phases.

4. The method of claim 1, wherein engaging in the first transmission of the data sequence is carried out by a first access node, and engaging in the second transmission of the data sequence is carried out by the same access node.

5. The method of claim 1, wherein the combined encoded sequence is based on encoding the first sequence of data using a first binary code and encoding the second sequence of data using a second binary code.

6. The method of claim 5, wherein the first binary code and the second binary code are Walsh codes.

7. The method of claim 5, wherein the first binary code and the second binary code have zero cross-correlation with each other.

8. A system comprising:

an antenna;

at least one processing unit;

at least one non-transitory data storage; and program instructions stored in the at least one non-transitory data storage and executable by the at least one processing unit to carry out operations for multi-phase transmission of a data sequence from the antenna, wherein the operations comprise:

engaging in a first transmission of the data sequence from the antenna, and automatically engaging in a second transmission of the data sequence from the antenna with a phase delay compared with the first transmission, wherein automatically engaging in the second transmission of the data sequence from the antenna with the phase delay comprises automatically engaging in the second transmission of the data sequence after engaging in the first transmission of the data sequence, wherein engaging in the first transmission of the data sequence occurs with a first phase, and wherein engaging in the second transmission of the data sequence occurs with a second phase different from the first phase, wherein the data sequence is a combined encoded sequence comprising a first sequence of data and a second sequence of data, and wherein engaging in the first transmission and automatically engaging in the second transmission with the phase delay helps to simulate a multi-path effect and helps to facilitate successful receipt of the data sequence by a receiving device.

9. The system of claim 8, wherein automatically engaging in the second transmission of the data sequence from the antenna with the phase delay comprises:

automatically engaging in the second transmission of the data sequence a predefined amount after engaging in the first transmission of the data sequence.

10. The system of claim 8, wherein engaging in the first transmission of the data sequence is carried out by a first access node and engaging in the second transmission of the data sequence is carried out by the same access node.

11. A wireless communication system comprising:

a wireless communication interface including an antenna;

a backhaul communication interface through which to communicate with other entities; and a controller, wherein the controller is configured to cause the wireless communication system to carry out operations for multi-phase transmission of a data sequence from an antenna, wherein the operations comprise:

engaging in a first transmission of the data sequence from the antenna, and automatically engaging in a second transmission of the data sequence from the antenna with a phase delay compared with the first transmission, wherein automatically engaging in the second transmission of the data sequence from the antenna with the phase delay comprises automatically engaging in the second transmission of the data sequence after engaging in the first transmission of the data sequence, wherein engaging in the first transmission of the data sequence occurs with a first phase, and wherein engaging in the second transmission of the data sequence occurs with a second phase different from the first phase, wherein the data sequence is a combined encoded sequence comprising a first sequence of data and a second sequence of data, and wherein engaging in the first transmission and automatically engaging in the second transmission with the phase delay helps to simulate a multi-path effect and helps to facilitate successful receipt of the data sequence by a receiving device.

12. The wireless communication system of claim 11, wherein automatically engaging in the second transmission of the data sequence from the antenna with the phase delay comprises:

automatically engaging in the second transmission of the data sequence a predefined amount of time after engaging in the first transmission of the data sequence.

13. The wireless communication system of claim 11, wherein the combined encoded sequence is based on encoding the first sequence of data using a first binary code and encoding the second sequence of data using a second binary code.

* * * * *